United States Patent
Luo

(10) Patent No.: US 10,236,876 B2
(45) Date of Patent: Mar. 19, 2019

(54) SWITCH CONTROL CIRCUIT WITH BOOSTER

(71) Applicant: CSMC TECHNOLOGIES FAB2 CO., LTD., Jiangsu (CN)

(72) Inventor: Chuan Luo, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 15/748,156

(22) PCT Filed: May 11, 2016

(86) PCT No.: PCT/CN2016/081685
§ 371 (c)(1),
(2) Date: Jan. 26, 2018

(87) PCT Pub. No.: WO2017/016274
PCT Pub. Date: Feb. 2, 2017

(65) Prior Publication Data
US 2018/0262191 A1    Sep. 13, 2018

(30) Foreign Application Priority Data

Jul. 28, 2015   (CN) .......................... 2015 1 0452720

(51) Int. Cl.
*H03K 17/06* (2006.01)
*H03K 17/16* (2006.01)
(Continued)

(52) U.S. Cl.
CPC ....... *H03K 17/6871* (2013.01); *H03K 17/102* (2013.01); *H03K 17/687* (2013.01); *H03K 19/017545* (2013.01); *H03K 2217/94* (2013.01)

(58) Field of Classification Search
CPC ......... H03K 17/687; H03K 19/017545; H03K 17/102; H03K 2217/94
See application file for complete search history.

(56) References Cited

U.S. PATENT DOCUMENTS

| | | | |
|---|---|---|---|
| 5,808,502 A * | 9/1998 | Hui ...................... | G11C 7/1006 327/333 |
| 6,380,792 B1 * | 4/2002 | Yamamoto ........... | H03K 17/063 327/390 |

(Continued)

FOREIGN PATENT DOCUMENTS

| | | |
|---|---|---|
| CN | 101540600 A | 9/2009 |
| CN | 101977046 | 9/2010 |

(Continued)

OTHER PUBLICATIONS

International Search Report and Written Opinion with English translation dated Jul. 26, 2016 issued in the corresponding International Application No. PCT/CN2016/081685, pp. 1-9.

(Continued)

*Primary Examiner* — Kenneth B Wells
(74) *Attorney, Agent, or Firm* — Polsinelli PC

(57) ABSTRACT

A switch control circuit includes: a clock circuit (110) configured to generate a first clock control signal (CLK1) and a second clock control signal (CLK2); a voltage boosting circuit (120) configured to receive the second clock control signal (CLK2) and an operating voltage outputted by the power source (VDD); and boost the operating voltage by a preset value to form a switch control signal (H1) under the control of the second clock control signal (CLK2); and an inverting circuit (130) configured to receive the first clock control signal (CLK1) and the switch control signal (H1), and determine whether or not to output the switch control signal (H1) to the switch circuit according to the first clock (Continued)

control signal (CLK1), so as to control on/off of the switch circuit.

10 Claims, 4 Drawing Sheets

(51) Int. Cl.
  *H03K 17/687* (2006.01)
  *H03K 17/10* (2006.01)
  *H03K 19/0175* (2006.01)

(56) References Cited

U.S. PATENT DOCUMENTS

| | | | | |
|---|---|---|---|---|
| 6,404,237 | B1* | 6/2002 | Mathew | H03K 17/063 |
| | | | | 326/106 |
| 6,693,479 | B1* | 2/2004 | Bardsley | H02M 3/07 |
| | | | | 327/390 |
| 8,525,574 | B1* | 9/2013 | Duggal | H03K 17/063 |
| | | | | 327/390 |
| 8,624,663 | B2* | 1/2014 | Gagne | H03K 17/161 |
| | | | | 327/108 |
| 2007/0046359 | A1 | 3/2007 | Zanchi et al. | |

FOREIGN PATENT DOCUMENTS

| | | |
|---|---|---|
| CN | 102270981 A | 12/2011 |
| CN | 102545862 A | 7/2012 |
| CN | 103326700 A | 9/2013 |
| CN | 103762986 | 4/2014 |
| JP | 2009017640 A | 1/2009 |

OTHER PUBLICATIONS

Office Action (not translated) dated Aug. 1, 2018 issued in Chinese Patent Application No. 20150104527206, 11 pages.

* cited by examiner

SWITCH CONTROL CIRCUIT WITH BOOSTER

CROSS REFERENCE TO RELATED APPLICATIONS

This application is a National Phase filing under 35 U.S.C. § 371 of PCT/CN2016/081685 filed May 11, 2016; and this application claims priority to Chinese Application No. 201510452720.6 filed Jul. 28, 2015 under 35 U.S.C. § 119. The entire contents of each application are hereby incorporated by reference.

FIELD OF THE INVENTION

The present disclosure relates to the field of circuit control, and particularly relates to a switch control circuit.

BACKGROUND OF THE INVENTION

In some high-speed and high-precision signal processing and conversion circuits, it needs some switches to implement the process in which the analog signal is acquired and transmitted. A switch control circuit is configured to control on/off of these switches. Under the premise that the characteristics of the transistors that constitute the switch are constant, the higher the voltage driving the switch is, the smaller the on-resistance of the switch is. The on-resistance is reduced, so that the speed at which the analog signal passes through the switch can be accelerated and the distortion of the analog signal can be reduced. The conventional switch control circuit can boost the driving voltage. However, when the system supply voltage is too high or the sampled analog signal has a large voltage range, it is easily caused that the driving voltage on the sampling switch is too high, so as to result in the risk that the sampling switch is broken down, which reduces reliability of the circuit.

SUMMARY OF THE INVENTION

Accordingly, it is necessary to provide a switch control circuit of higher reliability.

A switch control circuit configured to control on/off of a switch circuit includes: a clock circuit configured to generate a first clock control signal and a second clock control signal; a voltage boosting circuit coupled to the clock circuit and a power source of the switch control circuit, respectively; wherein the voltage boosting circuit is configured to receive the second clock control signal and an operating voltage outputted by the power source; and the voltage boosting circuit is configured to boost the operating voltage by a preset value to form a switch control signal under the control of the second clock control signal; and an inverting circuit coupled to the clock circuit and the voltage boosting circuit, respectively; wherein the inverting circuit is configured to receive the first clock control signal and the switch control signal, and the inverting circuit is configured to determine whether or not to output the switch control signal to the switch circuit according to the first clock control signal, so as to control on/off of the switch circuit.

In the above switch control circuit, the voltage boosting circuit can boost the operating voltage outputted by the power source by a preset value, to form a switch control signal and then output the switch control signal to the inverting circuit. The inverting circuit can determine whether or not to output the switch control signal to the switch circuit according to the first clock control signal so as to realize the control of on/off of the switch circuit. Since the voltage boosting value of the switch control signal is the preset value, the voltage boosting amount can be controlled and will not vary with the external factors. Therefore, there is no danger that the switch transistor in the switch circuit is broken down while the internal resistance of the switch circuit is reduced, which results in a higher reliability of the circuit.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
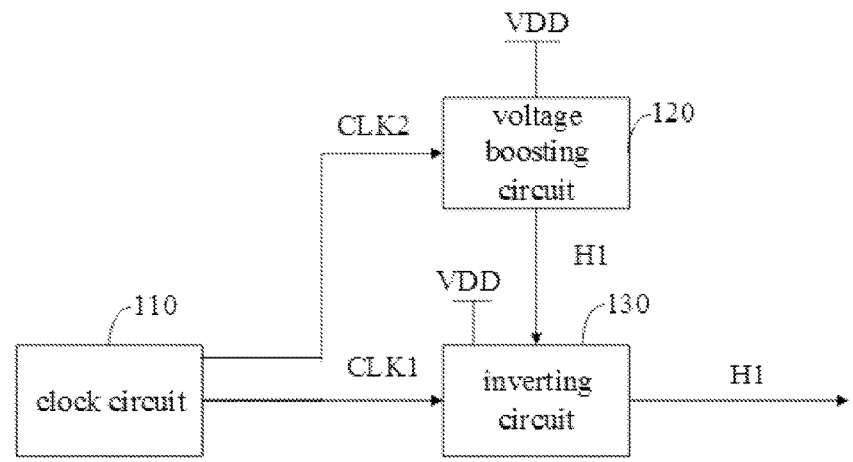
FIG. 1 is a block diagram of a switch control circuit in an embodiment.

FIG. 1 is a block diagram of a switch control circuit in an embodiment. The switch control circuit is configured to control on/off of the switch circuit. In the embodiment, the switch control circuit includes a clock circuit 110, a voltage boosting circuit 120 and an inverting circuit 130. The clock circuit 110 is coupled to the voltage boosting circuit 120 and the inverting circuit 130, respectively. The inverting circuit 130 is coupled to the voltage boosting circuit 120 and is also coupled to the switch circuit.

The clock circuit 110 is configured to generate two clock control signals and output the two clock control signals respectively to the voltage boosting circuit 120 and the inverting circuit 130. Particularly, the two generated clock control signals are the first clock control signal CLK1 and the second clock control signal CLK2, respectively. In the embodiment, the phases of the first clock control signal CLK1 and the second clock control signal CLK2 are complementary to each other and do not overlap with each other.

The voltage boosting circuit 120 is coupled to the clock circuit 110 and the power source VDD of the switch control circuit respectively and is configured to receive the second clock control signal CLK2 outputted by the clock circuit 110 and the operating voltage VDD outputted by the power source VDD. Under the control of the second clock control signal CLK2, the voltage boosting circuit 120 boosts the operating voltage VDD by a preset value to form the switch control signal H1 and output the switch control signal H1 to the inverting circuit 130.

The inverting circuit 130 is configured to receive the first clock control signal CLK1 and the switch control signal H1 outputted by the voltage boosting circuit 120, and determine whether or not to output the switch control signal H1 to the switch circuit according to high/low of the electrical level of the first clock control signal CLK1.

In the above switch control circuit, the voltage boosting circuit 120 can boost the operating voltage $V_{DD}$ outputted by the power source VDD by the preset value, to form the switch control signal H1 and then output the switch control signal H1 to the inverting circuit 130. The inverting circuit 130 can determine whether or not to output the switch control signal H1 to the switch circuit according to the first clock control signal CLK1 so as to realize the control of on/off of the switch circuit. Since the voltage boosting value of the switch control signal H1 is the preset value, the voltage boosting amount can be controlled and will not vary with the external factors. Therefore, there is no danger that the switch transistor in the switch circuit is broken down while the internal resistance of the switch circuit is reduced, which results in a higher reliability of the circuit.

Figure 2:
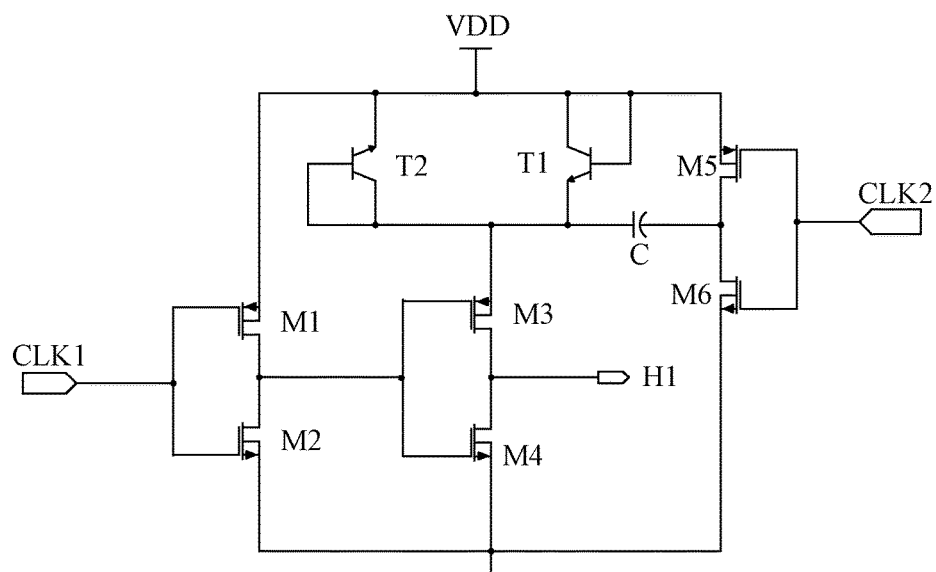
FIG. 2 is a circuit diagram of a switch control circuit in an embodiment.
Figure 3:
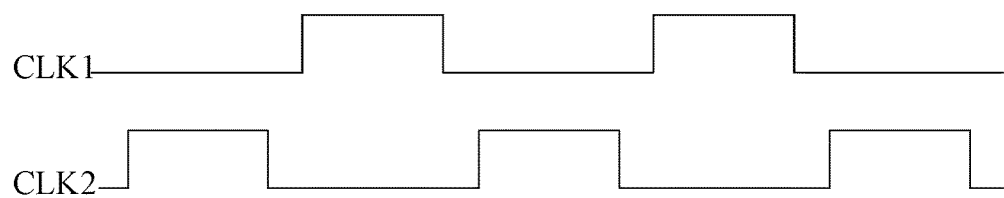
FIG. 3 is a schematic diagram of two clock control signals generated in the switch control circuit in FIG. 2.
Figure 4:
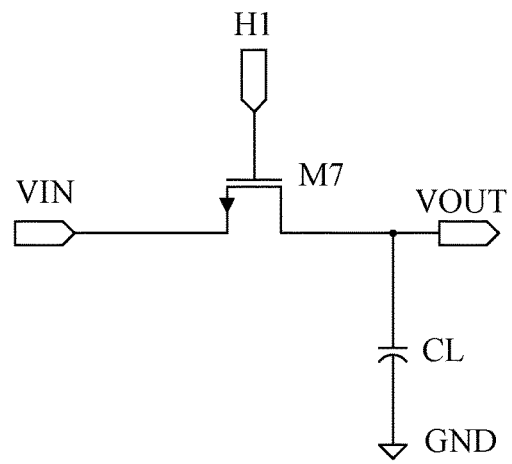
FIG. 4 is a circuit diagram of the switch circuit controlled by the switch control circuit in FIG. 2.

FIG. 2 is a circuit diagram of a switch control circuit in an embodiment (the clock circuit is not shown); FIG. 3 is a schematic diagram of two clock control signals generated in the switch control circuit in FIG. 2; FIG. 4 is a circuit diagram of the switch circuit corresponding to the switch control circuit in FIG. 2. In the following, in combination with FIG. 2, FIG. 3 and FIG. 4, the circuit structure of the switch control circuit and the operating process thereof will be described in detail in the embodiment.

The phases of the first clock control signal CLK1 and the second clock control signal CLK2 generated by the clock circuit are complementary to each other and do not overlap each other, which ensures that they will not have the same phase, as shown in FIG. 3.

The inverting circuit includes a first inverting unit and a second inverting unit. In the embodiment, both the first inverting unit and the second inverting unit are CMOS inverters. Particularly, the first inverting unit includes a first MOS transistor M1 and a second MOS transistor M2; and the second inverting unit includes a third MOS transistor M3 and a fourth MOS transistor M4. The first MOS transistor M1 and the third MOS transistor M3 are PMOS transistors, and the second MOS transistor M2 and the fourth MOS transistor M4 are NMOS transistors. Particularly, a gate of the first MOS transistor M1 is coupled to a gate of the second MOS transistor M2 and is coupled to an output of the first clock control signal CLK1 in the clock circuit, to receive the first clock control signal CLK1 outputted therefrom. A source of the first MOS transistor M1 is coupled to the power source VDD, and a drain of the first MOS transistor M1 is coupled to a drain of the second MOS transistor M2 and then is coupled to a gate of the third MOS transistor M3. The gate of the third MOS transistor M3 is coupled to a gate of the fourth MOS transistor M4. A source of the third MOS transistor M3 is coupled to the voltage boosting circuit. A drain of the third MOS transistor M3 is coupled to a drain of the fourth MOS transistor M4 as an output configured to output the switch control signal H1. A source of the second MOS transistor M2 is coupled to a drain source of the fourth MOS transistor M4 and is grounded.

The voltage boosting circuit includes a fourth inverting unit, a first switch transistor T1, a second switch transistor T2 and a bootstrap capacitor C. The fourth inverting unit is a CMOS inverter, which includes a fifth MOS transistor M5 and a sixth MOS transistor M6. The fifth MOS transistor M5 is a PMOS transistor, and the sixth MOS transistor is an NMOS transistor. The first switching transistor T1 and the second switch transistor T2 are both NPN transistors, that is to say, the input of the switch transistor is the collector of the NPN transistor, the base of the switch transistor is the control terminal of the NPN transistor, and the output of the switch transistor is the emitter of the NPN transistor. A gate of the fifth MOS transistor M5 is coupled to a gate of the sixth MOS transistor M6 and is coupled to an output of the second clock control signal CLK2 of the clock circuit to receive the second clock control signal CLK2 outputted therefrom. A source of the fifth MOS transistor M5 is coupled to the power source VDD, a drain of the fifth MOS transistor M5 is coupled to a drain of the sixth MOS transistor M6 and to a negative plate of a bootstrap capacitor C. A positive plate of the bootstrap capacitor C is coupled to an emitter of the first switch transistor T1, a collector of the second switch transistor T2, and a source of the third MOS transistor M3, respectively. The collector of the first switch transistor T1 is coupled to a base of the first switch transistor T1 and then coupled to the power source VDD. An emitter of the second transistor T2 is coupled to the power source VDD. A base of the second switch transistor T2 is coupled to a collector of the second switch transistor T2.

In the embodiment, the switch circuit includes a switch transistor M7. The switch transistor M7 is an NMOS transistor, and a source of the switch transistor M7 is coupled to the sampling terminal to receive the sampled analog signal VIN. A drain of the switch transistor M7 is the output VOUT, which is also coupled to the sampling capacitor CL and then is grounded.

The operating process of the above switch control circuit is as follows particularly:

When the first clock control signal CLK1 is at the low level, the first MOS transistor M1 is turned on and the second MOS transistor M2 is turned off, so that the third MOS transistor is controlled to be turned off, the fourth MOS transistor is turned on, the output signal of the output is at the low level, and the switch transistor M7 is turned off. Therefore, the switch circuit is kept in the off state under the control of the output signal at the low level. When the first clock control signal CLK1 is at the low level, the second clock control signal is at the high level. Therefore, the fifth MOS transistor M5 is turned off, and the sixth MOS transistor M6 is turned on, so that the voltage of the negative plate of the bootstrap capacitor C is zero. The first switch transistor T1 is turned on and the second switch transistor T2 is turned off, so that the voltage of the positive plate of the bootstrap capacitor C is $(V_{DD}-V_{be})$, and $V_{be}$ is the forward conduction voltage of the first switch transistor T1. In the embodiment, $V_{be}$ is about 0.7V.

After the second clock control signal CLK2 is changed to be at the high level, the fifth MOS transistor M5 is turned on, the sixth MOS transistor M6 is turned off, and the voltage of the negative plate of the bootstrap capacitor C is changed to $V_{DD}$. According to the law of conservation of electric charge, the voltage of the positive plate of the bootstrap capacitor C becomes $(2V_{DD}-V_{be})$. In this case, the voltage of the positive plate of the bootstrap capacitor C is greater than $V_{DD}$, so the second switch transistor T2 is biased forwardly and the first switch transistor T1 is biased reversely. The electric charges of the bootstrap capacitor C are discharged by the second switch transistor T2, and the voltage of the positive plate of the bootstrap capacitor C is finally stabilized at $(V_{DD}+V_{be})$. When CLK1 is changed to be at the high level, the first MOS transistor M1 is turned off and the second MOS transistor M2 is turned on, so that the third MOS transistor M3 is turned on, the fourth MOS transistor M4 is turned off, and the output outputs the switch control signal H1 the voltage of which is $(V_{DD}+V_{be})$. The switch control signal H1 controls the switch transistor M7 to be turned on, so that the switch circuit is turned on, which implements sampling of the analog signal VIN.

In the embodiment, the formed switch control signal H1 serves as the control signal of the switch transistor M7 to significantly reduce the on-resistance of the switch transistor, and the voltage increment of the switch control signal H1 is fixed to be the forward conduction voltage of the second switch transistor T2, the value of which is about 0.7V. Therefore, the incremental voltage will not be too high, and will not cause the switch to be broken down, which improves the reliability of the circuit while the internal resistance of the switch circuit is reduced. Moreover, in this solution, the switch control circuit has a simple circuit structure and can be used flexibly, which can be widely applied to various process platforms. The above switch control circuit can avoid the possibility that the over high voltage is present in the circuit node, which improves the reliability of the circuit. Further, the layout area occupied by the switch control circuit is also small, which can satisfy most cases in which it needs to sample the analog signals with a high speed and a high precision.

Figure 5:
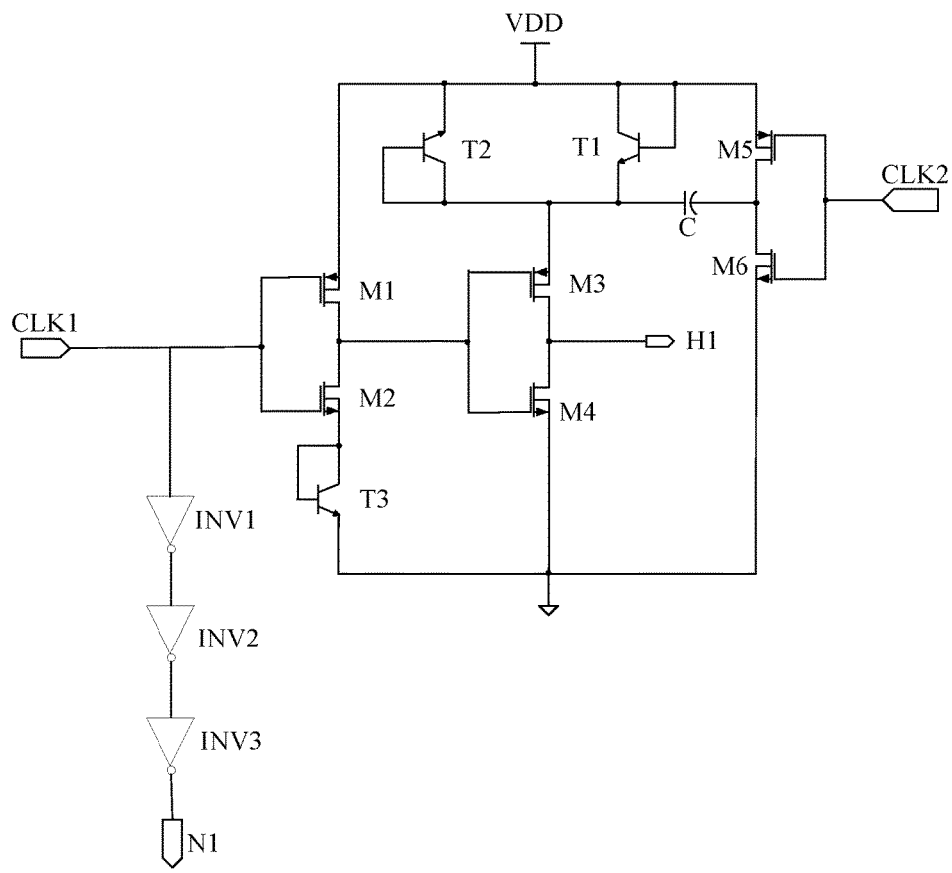
FIG. 5 is a circuit diagram of a switch control circuit in another embodiment.
Figure 6:
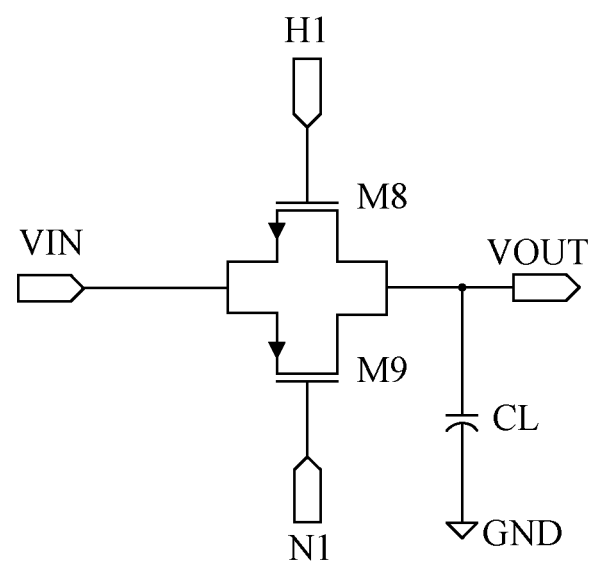
FIG. 6 is a circuit diagram of the switch circuit controlled by the switch control circuit in FIG. 5.

FIG. 5 is a circuit diagram of a switch control circuit in another embodiment. FIG. 6 is a circuit diagram of a switch circuit corresponding to the switch control circuit in FIG. 5. In the embodiment, the switch circuit includes a switch pair formed by a MOS transistor M8 and a MOS transistor M9. Particularly, the MOS transistor M8 is an NMOS transistor, and the MOS transistor M9 is a PMOS transistor. The inverting circuit in the switch control circuit further includes a third inverting unit and a delay circuit on the basis of the inverting circuit in the embodiment shown in FIG. 2.

In the embodiment, the switch circuit includes the MOS transistor M8 and the MOS transistor M9. Therefore, two control signals are required to control the MOS transistor M8 and the MOS transistor M9 respectively. The aforementioned switch control signal H1 is a first control signal and is outputted to a gate of the MOS transistor M8. The third inverting unit is configured to generate the second control signal N1 and output it to a gate of the MOS transistor M9 to control on/off of the MOS transistor M9. The second control signal N1 and the first control signal H1 are inverted to each other. Particularly, the third inverting unit includes three inverters INV1, INV2 and INV3 coupled in series. An output of the inverter INV3 outputs the second control signal N1.

Since the first clock control signal CLK1 is delayed by the three-stage inverter, in order to ensure that the pair of complementary signals of the first control signal H1 and the second control signal H2 N1 are synchronized in time sequence as much as possible, a delay circuit is set in the inverting circuit. The delay circuit includes a third switch transistor T3. An input of the third switch transistor T3 is coupled to the control terminal and then is coupled to a source of the second MOS transistor M2. An output of the third switch transistor T3 is grounded. The third switch transistor T3 is an NPN transistor. In the embodiment, the input of the third switch transistor T3 is a collector of an NPN-type transistor; the control terminal of the third switch transistor T3 is a base of the NPN-type transistor; and the output of the third switch transistor T3 is an emitter of the NPN transistor. In other embodiments, the third switch transistor T3 may also be an N-channel MOS transistor. Therefore, a three-stage delay is formed by the delay circuit, the first inverting unit and the second inverting unit, so as to ensure that the pair of complementary signals of the first control signal H1 and the second control signal H2 N1 are synchronized in time sequence to ensure that the MOS transistor M8 and the MOS transistor M9 can be turned on and turned off simultaneously.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A switch control circuit, comprising:
   a clock circuit configured to generate a first clock control signal and a second clock control signal;
   a voltage boosting circuit coupled to the clock circuit and a power source of the switch control circuit, respectively; wherein the voltage boosting circuit is configured to receive the second clock control signal and an operating voltage outputted by the power source, and the voltage boosting circuit is configured to boost the operating voltage by a preset value to form a switch control signal under control of the second clock control signal; and
   an inverting circuit coupled to the clock circuit and the voltage boosting circuit, respectively;
   wherein the inverting circuit is configured to receive the first clock control signal and the switch control signal, and the inverting circuit is configured to determine whether or not to output the switch control signal to the switch circuit according to the first clock control signal, so as to control on/off of the switch circuit;
   wherein the voltage boosting circuit comprises a specific inverting unit, a first switch transistor, a second switch transistor and a bootstrap capacitor;
   the specific inverting unit is coupled to the power source, the clock circuit and a negative plate of the bootstrap capacitor respectively;
   an input of the first switch transistor is coupled to the power source;
   an output of the first switch transistor is coupled to a positive plate of the bootstrap capacitor and the inverting circuit respectively;
   an input of the second switch transistor is coupled to the positive plate of the bootstrap capacitor and the inverting circuit respectively;
   an output of the second switch transistor is coupled to the power source; and
   the preset value is a forward conduction voltage.

2. The switch control circuit of claim 1, wherein the first clock control signal and the second clock control signal are complementary non-overlapping clock signals.

3. The switch control circuit of claim 2, wherein the inverting circuit comprises a first inverting unit and a second inverting unit; the first inverting unit and the second inverting unit are both CMOS inverters; the first inverting unit comprises a first MOS transistor and a second MOS transistor; the second inverting unit comprises a third MOS transistor and a fourth MOS transistor; the first MOS transistor and the third MOS transistor are PMOS transistors, and the second MOS transistor and the fourth MOS transistor are NMOS transistors; a gate of the first MOS transistor is coupled to a gate of the second MOS transistor and then coupled to the clock circuit so as to receive the first clock control signal; a source of the first MOS transistor is coupled to the power source; a drain of the first MOS transistor is coupled to a drain of the second MOS transistor and then coupled to a gate of the third MOS transistor; the gate of the third MOS transistor is coupled to a gate of the fourth MOS transistor; a source of the third MOS transistor is coupled to the voltage boosting circuit; a drain of the third MOS transistor and a drain of the fourth MOS transistor are coupled as an output to output the switch control signal; a source of the second MOS transistor is coupled to a source of the fourth MOS transistor and then is grounded.

4. The switch control circuit of claim 3, wherein the switch circuit comprises two switch transistors; the switch control signal is a first control signal; and the inverting circuit further comprises a third inverting unit coupled to the clock circuit and configured to receive the first clock control signal and invert the first clock control signal to form a second control signal, and output the second control signal to the switch circuit; and the first control signal and the second control signal control on/off of the two switch transistors in the switch circuit respectively.

5. The switch control circuit of claim 4, wherein the inverting circuit further comprises a delay circuit; the delay circuit is coupled between the source of the second MOS transistor and the ground to delay output of the first control signal, so that the first control signal and the second control signal are outputted synchronously.

6. The switch control circuit of claim 5, wherein the delay circuit comprises a third switch transistor; an input of the third switch transistor is coupled to the source of the second MOS transistor, and an output of the third switch transistor is grounded; and a control terminal of the third switch transistor is coupled to the input of the third switch transistor.

7. The switch control circuit of claim 6, wherein the third switch transistor is an NPN-type transistor.

8. The switch control circuit of claim 4, wherein the third inverting unit comprises three inverters coupled in series.

9. The switch control circuit of claim 1, wherein the specific inverting unit is a CMOS inverter and comprises a fifth MOS transistor and a sixth MOS transistor; the fifth MOS transistor is a PMOS transistor, and the sixth MOS transistor is an NMOS transistor; a gate of the fifth MOS transistor is coupled to a gate of the sixth MOS transistor and then coupled to the clock circuit to receive the second clock control signal; a source of the fifth MOS transistor is coupled to the power source; a drain of the fifth MOS transistor is coupled to a drain of the sixth MOS transistor and then coupled to the negative plate of the bootstrap capacitor; and a source of the sixth MOS transistor is grounded.

10. The switch control circuit of claim 9, wherein the first switch transistor and the second switch transistor are NPN-type transistors.

* * * * *